United States Patent
Cho

(10) Patent No.: US 6,185,151 B1
(45) Date of Patent: Feb. 6, 2001

(54) SYNCHRONOUS MEMORY DEVICE WITH PROGRAMMABLE WRITE CYCLE AND DATA WRITE METHOD USING THE SAME

(75) Inventor: Ho-yeol Cho, Seoul (KR)

(73) Assignee: Samsung Electronics Co., Ltd., Kyungki-do (KR)

(*) Notice: Under 35 U.S.C. 154(b), the term of this patent shall be extended for 0 days.

(21) Appl. No.: 09/548,220

(22) Filed: Apr. 12, 2000

(30) Foreign Application Priority Data

Jun. 26, 1999 (KR) .................................................. 99/24446

(51) Int. Cl.[7] ........................................................ G11C 8/00
(52) U.S. Cl. ...................... 365/233; 365/203; 365/230.06
(58) Field of Search .................................. 365/233, 203, 365/230.06

(56) References Cited

U.S. PATENT DOCUMENTS 4,394,753 * 7/1983 Penzel .................... 365/236
5,844,859 * 12/1998 Iwamoto et al. ............ 365/233

* cited by examiner

*Primary Examiner*—Huan Hoang
(74) *Attorney, Agent, or Firm*—Skjerven Morrill MacPherson LLP; David W. Heid

(57) ABSTRACT

A synchronous memory device capable of performing write operation with a programmable write cycle, and a data write method using the synchronous memory device. The synchronous memory device includes a memory cell array having a plurality of memory cells arranged in rows and columns, a precharge circuit for precharging a data input/output line which transmits data to be written to the memory cells, with a predetermined voltage level, and a column selection circuit for writing the data transmitted to the data input/output line to a selected memory cell, in response to activation of a column selection signal. The activation cycle of the column selection signal is determined according to the write cycle modes programmed in a mode register set. The write cycle modes can be programmed in the mode register set with system clock frequency information, so that the number of data write operations per clock cycle can be varied. Thus, a maximum operating speed of a system is not restricted by the data write period of time of the memory device.

19 Claims, 7 Drawing Sheets

SYNCHRONOUS MEMORY DEVICE WITH PROGRAMMABLE WRITE CYCLE AND DATA WRITE METHOD USING THE SAME

BACKGROUND OF THE INVENTION

1. Field of the Invention

The present invention relates to synchronous memory devices, and more particularly, to a synchronous memory device in which data are written to memory cells in response to activation of a write command, and a data write method using the same.

2. Description of the Related Art

At present, for the purpose of improving the access time of memory devices, synchronous memory devices in which operation is synchronized with an external system clock have been developed. In synchronous memory devices, a data write or read operation is controlled based on the external system clock signal. Thus, if the frequency of the system clock signal increases due to an increase in the operating speed of an external system that outputs the clock signal, the operating speed for the data write or read must be increased in response to the frequency increase.

In a general synchronous memory device, a reduced access time to the memory device relative to the system clock frequency during a data read operation can be implemented by increasing column address strobe (CAS) latency. CAS latency is defined as the period of time from the activation of a CAS signal to the output of data. That is, as the operating frequency of an external system increases due to a high operating speed thereof, the data can be output in synchronism with the system clock by increasing the CAS latency.

During the data read operation, although the read operating speed of the synchronous memory device can not increased, data can be output in synchronization with the system clock having an increased frequency, as long as the point in time at which data is read from the point in time at which the CAS signal was generated, that is, the CAS latency, is increased. This is possible because during the data read operation, the address of the succeeding memory cell to be read can be input in advance while the present data is being processed.

However, unlike the data read operation, during the data write operation, the process of writing the present data must be completed before inputting the succeeding data process. However, the data write period of time, i.e., from the activation of a write command to the data writing to the memory cell, is shorter than the system clock cycle, so that one write operation can be completed within the system clock cycle.

However, as the system clock cycle is shortened with the increased operating speed of the system, the data write operation cannot be completed within the system clock cycle. Thus, the maximum operating speed of the system is restricted by the write cycle of the memory device therein.

SUMMARY OF THE INVENTION

According to an aspect of the present invention, there is provided a synchronous memory device capable of performing a write operation in synchronism with a reference clock signal. The synchronous memory device comprises: a memory cell array including a plurality of memory cells arranged in rows and columns; a precharge circuit for precharging a data input/output line which transmits data to be written to the memory cells, with a predetermined voltage level; a column selection circuit for writing the data transmitted to the data input/output line to a selected memory cell, in response to activation of a column selection signal; and a mode register set for setting write cycle modes. The activation cycle of the column selection signal is determined according to the write cycle modes programmed in the mode register set.

Preferably, one of the write cycle modes is selected by a user. The write cycle modes may be classified according to the number of reference clock cycles for a period of time from the input of a write command to the writing of data to the memory cell.

In another embodiment, the present invention provides a synchronous memory device for initiating a write operation of data to a memory cell in response to the activation of a column selection signal after a write command is input, and terminating the write operation in response to inactivation of the column selection signal. The synchronous memory device comprises: a control signal generating circuit for receiving a system clock signal, a column address strobe signal and a write enable signal to generate a column selection line disable signal which disables the column selection signal; and a mode register set into which write cycle modes are programmed, one of the write cycle modes being selected in response to an address designated by a user. The activation cycle of the column selection signal is determined according to the write cycle modes which are programmed into the mode register based on the reference clock cycle.

Preferably, the control signal generating circuit comprises: a clock buffer for generating a reference clock signal based on which data are input and output, in response to the system clock signal; a column address strobe buffer for generating a column selection control signal that is enabled for a predetermined period of time in response to activation of the column address strobe signal; and a write enable buffer for generating a write master signal that is enabled for a predetermined period of time in response to the activation of the write enable signal, and generating a write master delay signal, which is delayed by a predetermined period of time relative to the write master signal, in the second write cycle mode. Also, the control signal generating circuit further comprises: a precharge signal generating circuit for precharging a data input/output line in response to the reference clock signal, and generating a precharge signal which is disabled for a predetermined period of time during which the write master delay signal is enabled; and a column selection line disable signal generating circuit for generating a column selection line disable signal that disables a column selection line, in response to the precharge signal and the column selection control signal.

According to another aspect of the present invention, there is provided a data write method for a synchronous memory device for writing data to a particular memory cell in response to activation of a column selection signal. The number of reference clock cycles required for execution of a write command is programmed and then stored in at least one bit of a mode register set of the synchronous memory device. Upon receiving a write enable signal, which changes a mode to a write mode, a write master signal and a write master delay signal are generated. An input/output line precharge signal is generated in response to the reference clock signal and the write master delay signal, wherein the precharge signal is disabled for the execution of the write command if the programmed number of reference clock cycles is more than one. A column selection line disable signal, which is disabled in response to activation of the precharge signal, is generated, and a column selection signal, which is enabled in response to the activation of the column selection line corresponding to a decoded address, and is disabled in response to the column selection line disable signal, is then generated.

Thus, the system clock frequency information is classified into write cycle modes and programmed in a mode register set, so that the number of cycles for write operation can be varied. Accordingly, the operating speed of the system can be increased to a maximum level which is not limited by the write cycle time of the memory device.

BRIEF DESCRIPTION OF THE DRAWINGS

The above objects and advantages of the present invention will become more apparent by the following explanation and reference to the drawings in which.

DESCRIPTION OF THE PREFERRED EMBODIMENTS

The present invention now will be described more fully with reference to the accompanying drawings, in which preferred embodiments of the invention are shown. These embodiments are provided so that this disclosure will be thorough and complete, and will fully convey the concept of the invention to those skilled in the art.

Figure 1:
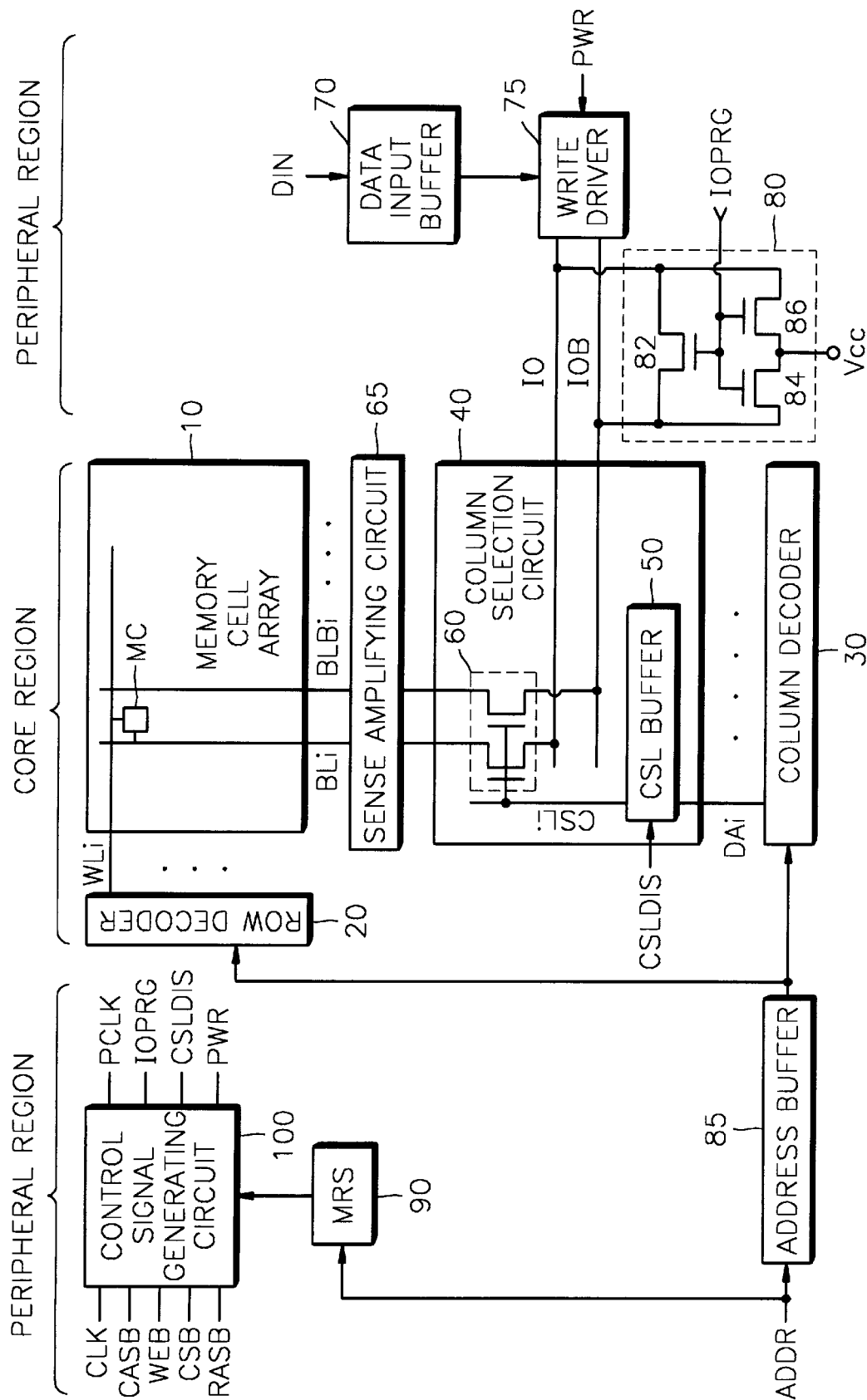
FIG. 1 is a block diagram of a memory device according to an exemplary embodiment of the present invention.

A memory device according to an exemplary embodiment of the present invention is shown in FIG. 1, in which circuits located on a data write path are shown for convenience of explanation, is a synchronous dynamic random access memory (SDRAM) in which data input/output operation is controlled by a reference clock signal PCLK which is generated in response to an external system clock signal CLK.

Referring to FIG. 1, the memory device includes a core region including circuits used to select particular memory cells, and peripheral regions including circuits for generating a variety of signals for the core region. The core region includes a memory cell array 10, a row decoder 20, a column decoder 30, a column selection circuit 40 and a sense amplifying circuit 65. The memory cell array 10 includes a number of memory cells MC, which are located at the cross-points between a plurality of word lines WLi, and a plurality of bit line pairs BLi and BLBi. The row decoder 20 and the column decoder 30 are used to select particular cells, for example, a memory cell MC, in the memory cell array 10.

The column selection circuit 40 connects the bit line pair BLi and BLBi, which are selected by a decoded address DAi, to a data input/output line pair IO and IOB. The sense amplifying circuit 65 senses and amplifies the data of the selected bit line pair BLi and BLBi, and then transfers the amplified data to the data input/output line pair IO and IOB. Also, the sense amplifying circuit 65 senses and amplifies data of the data input/output line pair IO and IOB, and then transmits the amplified data to the bit line pair BLi and BLBi. Here, the row decoder 20, the column decoder 30 and the sense amplifying circuit 65 can be implemented with well-known circuits. In particular, the column selection circuit 40 includes a column selection line (CSL) buffer 50 and a column switch 60. The CSL buffer 50 generates a column selection signal CSLi which is enabled in response to activation of the decoded address DAi, and is disabled in response to a column selection line disable signal CSLDIS. The column switch 60 connects the selected bit line pair BLi and BLBi to the data input/output line pair IO and IOB in response to the activation of the column selection signal CSLi.

The peripheral regions include an address buffer 85, a data input buffer 70, a write driver 75 and a precharge circuit 80. The address buffer 85 and the data input buffer 70 convert the levels of an address ADDR and write data DIN, respectively, which are input from the outside, into CMOS levels. The write driver 75 transmits the write data DIN received from the data input buffer 70 to the data input/output line pair IO and IOB, in response to a write master signal PWR. The precharge circuit 80 precharges the data input/output line pair IO and IOB with a predetermined voltage before write and read operations. The address buffer 85 and the data input buffer 70 may be implemented with well-known circuits. The write master signal PWR, which enables the write driver 75, is activated in a write mode. That is, the write master signal PWR is a signal which indicates that the memory device is in the write mode. In particular, the precharge circuit 80 is activated in response to a precharge signal IOPRG, and may be implemented with an equalizer 82 for equalizing the voltage level of the data input/output line pairs IO and IOB, and precharge transistors 84 and 86 for keeping the voltage level of the data input/output line pairs IO and IOB at a predetermined level, for example, at a power voltage Vcc.

Also, the peripheral regions may include a control signal generating circuit 100 and a mode register set (MRS) 90. The control signal generating circuit 100 receives a clock signal CLK, a column address strobe signal CASB and a write enable signal WEB from the outside to generate a variety of control signals, the reference clock signal PCLK, the precharge signal IOPRG, the column selection line disable signal CSLDIS and the write master signal PWR, for controlling the operation of the memory device. The control signal generating circuit 100 is described later in greater below with reference to FIG. 2.

The MRS 90 is for programming the operation of the memory device and is programmed to provide a variety of operating modes suitable for the system. The operating modes programmed by the MRS 90 may include, for example, a burst length mode for defining the burst length, a burst type for defining whether the burst sequence is present or not, and a latency mode for defining the cycle from input of a column address to data output.

In the present invention, a write cycle mode WM for defining the period of writing time based on the reference clock cycle is further programmed as well as the above modes. In the programming of the write cycle mode WM, information about the system clock signal CLK is utilized, and the number of reference clock signal cycles, which are required from the input of a write command to the writing of data to the memory cell, is also considered. When the write cycle mode WM is selected, the control signal generating circuit 100 generates the control signals, the reference clock signal PCLK, the precharge signal IOPRG, the column selection line disable signal CSLDIS and the write master signal PWR, for write operation The write cycle mode WM may be selected by the address ADDR, which is input from the outside, as in other programmed modes in the MRS 90. For example, when input signals CASB, WEB, CSB and RASB of the control signal generating circuit 100 are all logic low, wherein CS represents a chip selection signal and RASB represents a row address strobe signal, the address that is input in synchronization with the system clock signal CLK is recognized as mode register information. Preferably, the write cycle mode WM is implemented with a mode register, which uses at least one bit in size, such that one of at least two write cycle modes can be selected.

In other words, in the memory device according to the embodiment of the present invention, information concerning the system clock frequency is programmed as the write cycle mode WM in the MRS 90. Also, when the write cycle mode WM is selected by a user, the precharge signal IOPRG and the column selection line disable signal CSLDIS are generated, such that the write operation of the memory device is controlled in response to the system clock frequency. For example, when the system operates at a low operating speed, which is low enough for the write operation to be completed in one cycle of the system clock signal CLK, the write cycle mode is programmed such that one write operation is carried out every cycle of the system clock signal CLK. However, when the system operates at a high operating speed, which is too high to complete the write operation in one cycle of the system clock signal CLK, the write cycle mode is programmed such that the write operation is carried out during several cycles of the system clock signal CLK.

As described above, although the system clock cycle is short due to a high operating speed of the system, the memory device according to the present invention can perform a normal write operation. Unlike conventional techniques, the maximum operating speed of the system is not restricted by the period of time required to write data to the memory device.

Figure 2:
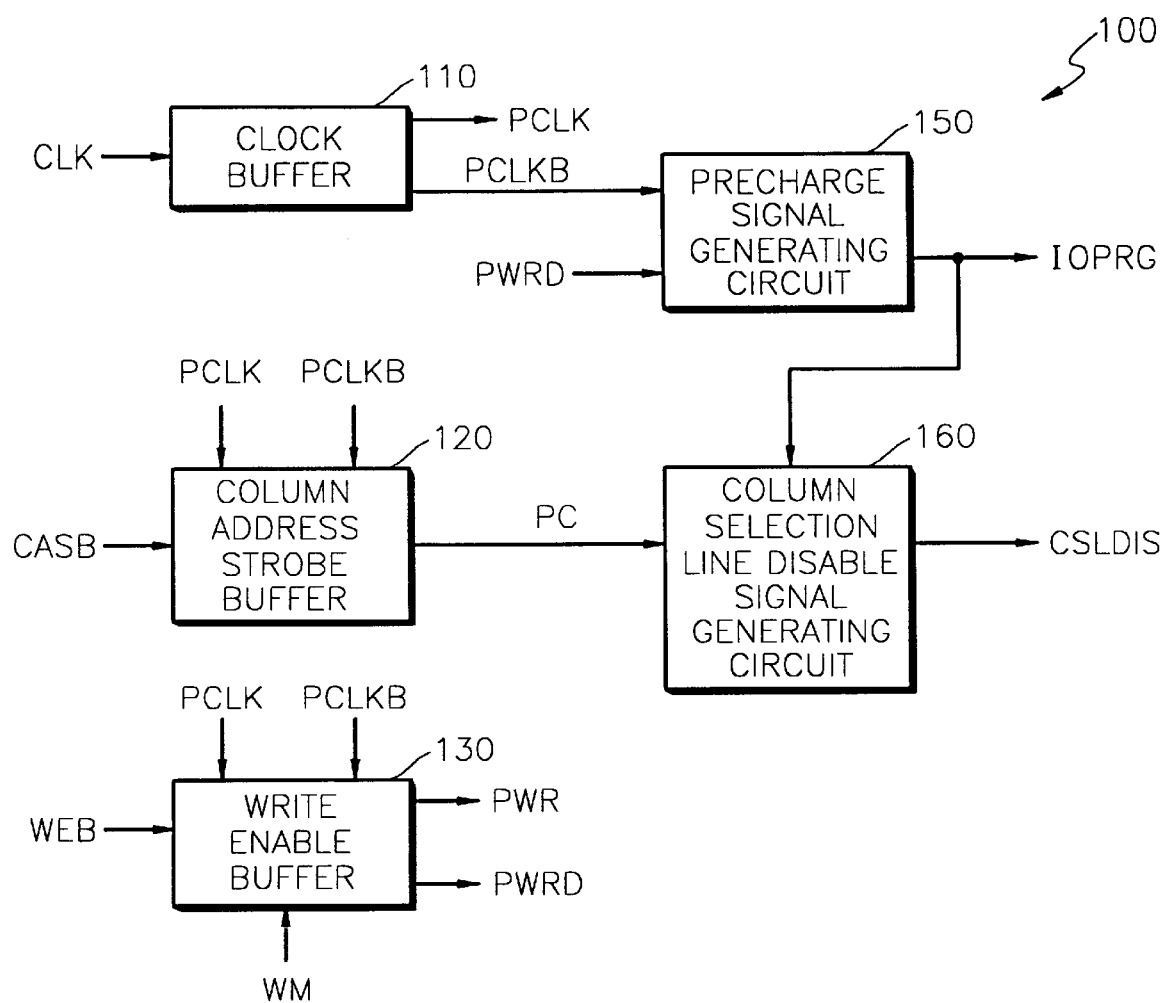
FIG. 2 is a block diagram of the control signal generating circuit of FIG. 1.

FIG. 2 is a block diagram of the control signal generating circuit 100 of FIG. 1. Referring to FIG. 2, the control signal generating circuit 100 includes a clock buffer 110, a column address strobe buffer 120, a write enable buffer 130, a precharge signal generating circuit 150 and a column selection line disable signal generating circuit 160. The clock buffer 110 receives the system clock signal CLK to generate the reference clock signals PCLK and PCLKB on which the input or output of the data is based. The signal PCLKB is the inverted signal of the reference clock signal PCLK. The clock buffer 110 is described below in greater detail with reference to FIG. 3.

The column address strobe buffer 120 receives the column address strobe signal CASB, which is input from the outside in synchronization with the system clock signal CLK, and the reference clock signals PCLK and PCLKB, which are generated by the clock buffer 110, to generate a column selection control signal PC. The column selection control signal PC is enabled for a predetermined period of time in response to activation of the column address strobe signal CASB (see FIGS. 9 and 10). The column address strobe buffer 120 is described below in greater detail with reference to FIG. 4.

The write enable buffer 130 receives the write enable signal WEB, which is input from the outside, the internal clock signals PCLK and PCLKB, and the write cycle mode WM, to generate the write master signal PWR and a write master delay signal PWRD. The write enable signal WEB is received by the write enable buffer 130 in synchronization with the system clock signal CLK and is activated to a logic low level. When the write enable signal WEB is at the logic low level, the memory device changes the mode from a read mode to a write mode. The write master signal PWR is activated for a predetermined period of time in response to the activation of the write enable signal WEB (see FIGS. 9 and 10), and is provided to the write driver 75 of FIG. 1 as a control signal. Also, the write master delay signal PWRD is generated in different forms depending on the write cycle mode WM, and is also provided to the precharge signal generating circuit 150 as a control signal. The write enable buffer 130 will later be described in detail with reference to FIG. 5.

The precharge signal generating circuit 150 receives the reference clock signal PCLKB and the write master delay signal PWRD to generate the precharge signal IOPRG. The precharge signal IOPRG is activated for a precharge period of time to precharge the data input/output line pair IO and IOB with a predetermined voltage level, and is inactivated for an active period of time during which data is written or read, to allow the data to be loaded onto the data input/output line pairs IO and IOB. The precharge signal IOPRG is provided to the precharge circuit 80 of FIG. 1 and the column selection line disable signal generating circuit 160 as input signals. The precharge signal generating circuit 150 is described below in detail with reference to FIG. 6.

The column selection line disable signal generating circuit 160 receives the precharge signal IOPRG and the column selection control signal PC, to generate the column selection line disable signal CSLDIS. The column selection line disable signal CSLDIS, which disables the column selection signal CSLi, is input to the CSL buffer 50 of FIG. 1. The column selection line disable signal generating circuit 160 is described below in detail with reference to FIG. 7.

Figure 3:
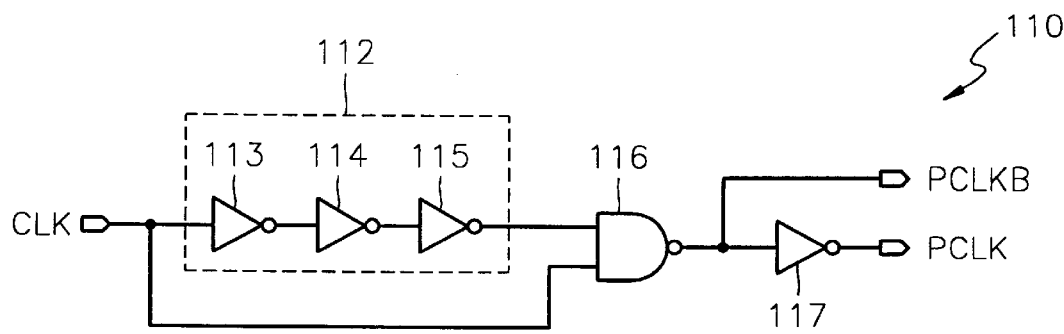
FIG. 3 is a detailed circuit diagram of the clock buffer of FIG. 2.

FIG. 3 is a detailed circuit of the clock buffer 110 of FIG. 2. Referring to FIG. 3, the clock buffer 110 includes an invert and delay unit 112, a logic unit 116 and an inverting unit 117. In particular, the invert and delay unit 112 is implemented with a plurality of inverters 113, 114 and 115, which receive the system clock signal CLK, and inverts and delays the system clock signal CLK. The logic unit 116 is implemented with a 2-input NAND gate, which receives the output signal of the invert and delay unit 112 and the system clock signal CLK, and the inverting unit 117 is implemented with an inverter. Here, the output of the logic unit 116 is provided as the reference clock signal PCLKB and the output of the inverting unit 117 is provided as the reference clock signal PCLK.

Figure 4:
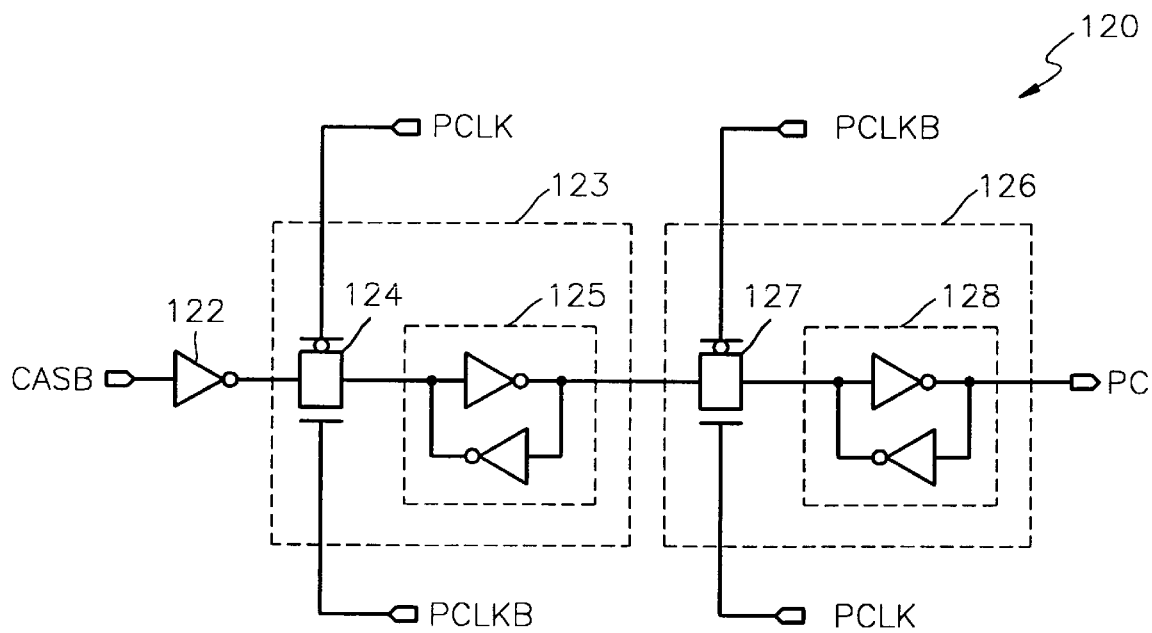
FIG. 4 is a detailed circuit diagram of the column address strobe buffer of FIG. 2.

FIG. 4 is a detailed circuit of the column address strobe buffer 120 of FIG. 2. As shown in FIG. 4, the column address strobe buffer 120 includes an inverting unit 122 and first and second transfer units 123 and 126. The inverting unit 122 inverts the received column address strobe signal CASB. The first and second transfer units 123 and 126 transfer an input signal in response to the falling and rising edges of the reference clock signal PCLK, respectively, and are each implemented with a transmission gate and an inverter latch. In particular, the first transfer unit 123 includes a transmission gate 124 and an inverter latch 125, and the second transfer unit 126 includes a transmission gate 127 and an inverter latch 128.

In operation, when the reference clock signal PCLK is transited to the logic low level, the transmission gate 124 of the first transfer unit 123 is turned on, and the column address strobe signal CASB input through the inverting unit 122 is latched by the inverter latch 125 for a half cycle of the reference clock signal PCLK. Also, when the reference clock signal PCLK is transited to the logic high level, the transmission gate of the second transfer unit 126 is turned on, and the column address strobe signal CASB latched in the first transfer unit 123 is latched again by the inverter latch 128 for the remaining half cycle of the reference clock signal PCLK. Then, the inverter latch 128 outputs the latched column address strobe signal CASB as the column selection control signal PC.

Thus, the column address strobe buffer 120 receives and inverts the column address strobe signal CASB in response to the falling edge of the reference clock signal PCLK, inverts and latches the received column address strobe signal CASB for one half of the clock cycle, and then inverts and outputs the column address strobe signal CASB in response to the rising edge of the reference clock signal PCLK.

Figure 5:
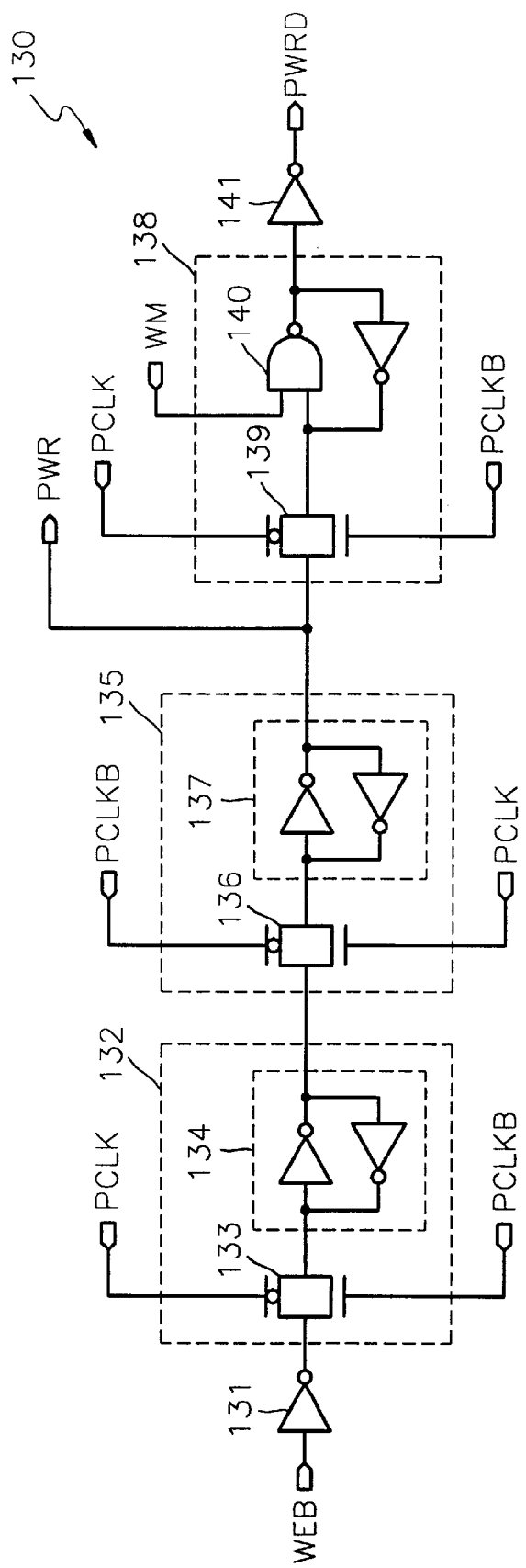
FIG. 5 is a detailed circuit diagram of the write enable buffer of FIG. 2.

FIG. 5 is a detailed circuit diagram of the write enable buffer 130 of FIG. 2. As shown in FIG. 5, the write enable buffer 130 includes a first inverting unit 131, first through third transfer units 132, 135 and 138, and a second inverting unit 141. In particular, the first inverting unit 131 inverts and outputs the write enable signal WEB. The first transfer unit 132 receives the output signal from the first inverting unit 131 in response to the falling edge of the reference clock signal PCLK, and inverts and latches the received signal for one half cycle of the reference clock signal PCLK.

The second transfer unit 135 receives the output signal from the first transfer unit 132 in response to the rising edge of the reference clock signal PCLK, and inverts and latches the received signal for the remaining half cycle of the reference clock signal PCLK. The first transfer unit 132 may be implemented with a transmission gate 133 and an inverter latch 134, and the second transfer unit 135 may be implemented with a transmission gate 136 and an inverter latch 137. The output signal from the second transfer unit 135 is provided as the write master signal PWR.

The third transfer unit 138 receives the output signal from the second transfer unit 135, i.e., the write master signal PWR, in response to a falling edge of the reference clock signal PCLK, and inverts and latches the write master signal PWR when the logic state of the write cycle mode WM is high. When the write cycle mode signal WM is the logic low level, the third transfer unit 138 outputs a logic high level irrespective of the write master signal PWR. The second inverting unit 141 inverts the output signal from the third transfer unit 138 and outputs the write master delay signal PWRD.

In other words, when the write cycle mode WM is at the logic low level, the write master delay signal PWRD remain at the logic low level. When the write cycle mode WM is at the logic high, the write master delay signal PWRD is the half-cycle delayed signal of the write master signal PWR.

Figure 6:
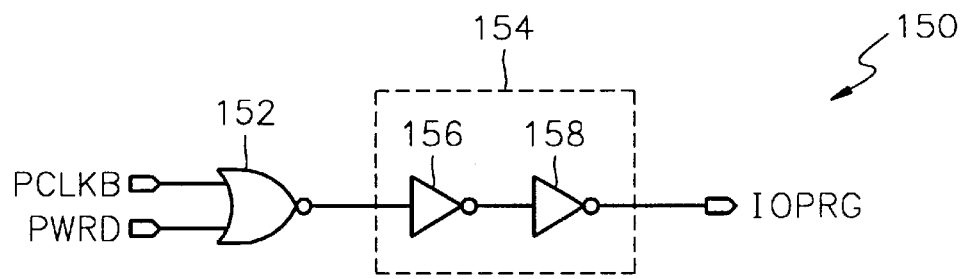
FIG. 6 is a detailed circuit diagram of the precharge signal generating circuit of FIG. 2.

FIG. 6 is a detailed circuit of the precharge signal generating circuit 150 of FIG. 2. As shown in FIG. 6, the precharge signal generating circuit 150 includes a logic unit 152 and a delay unit 154. The logic unit 152 is implemented with a 2-input NOR gate that receives the reference clock signal PCLKB and the write master delay signal PWRD, and the delay unit 154 is implemented with inverters 156 and 158. Thus, the precharge signal generating circuit 150 inverts and outputs the reference clock signal PCLKB, but generates the precharge signal IOPRG, which is disabled at a logic low, when the write master delay signal PWRD is enabled at a logic high.

Figure 7:
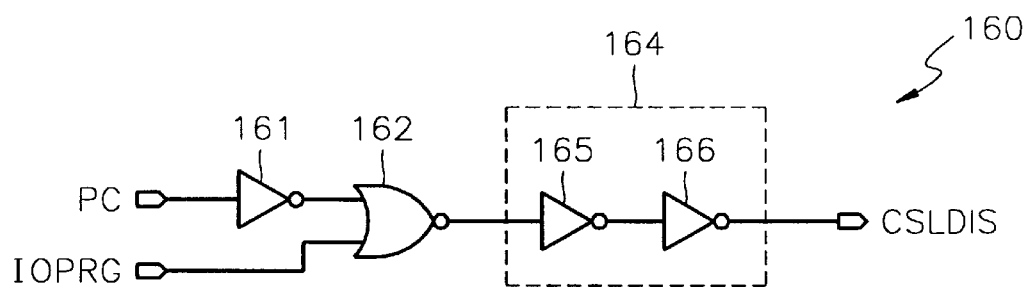
FIG. 7 is a detailed circuit diagram of the column selection line disable signal generating circuit of FIG. 2.

FIG. 7 is a detailed circuit of the column selection line disable signal generating circuit 160 of FIG. 2. As shown in FIG. 7, the column selection line disable signal generating circuit 160 includes an inverting unit 161, a logic unit 162 and a delay unit 164. The inverting unit 161 inverts and outputs the column selection control signal PC, which is the output signal from the column address strobe buffer 120. The logic unit 162 is implemented with a 2-input NOR gate that receives the output signal from the inverting unit 161 and the precharge signal IOPRG. The delay unit 164 is implemented with inverters 165 and 166. Thus, the column selection line disable signal generating circuit 160 inverts and outputs the precharge signal IOPRG, but generates the column selection line disable signal CSLDIS, which is disabled at a logic low, when the column selection control signal PC is disabled at a logic low.

Figure 8:
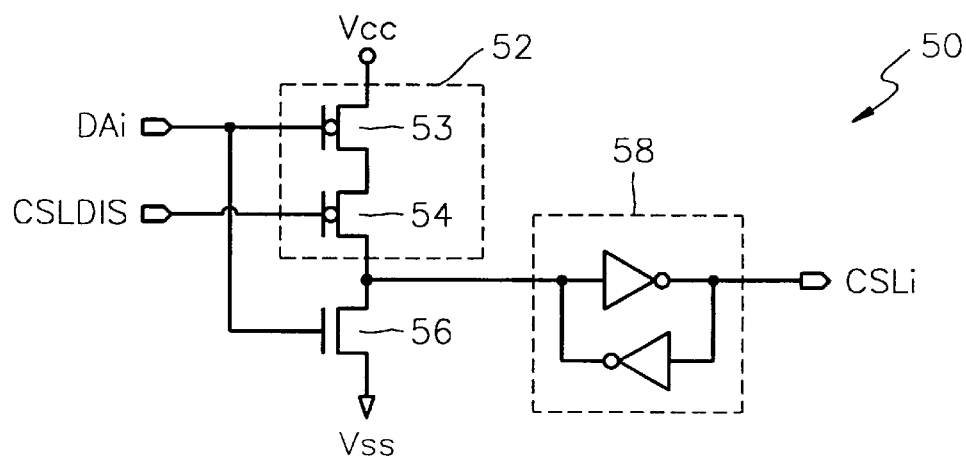
FIG. 8 is a detailed circuit diagram of the column selection line buffer of FIG. 1.

FIG. 8 is a detailed circuit of the CSL buffer 50 of FIG. 1. Referring to FIG. 8, the column selection line buffer 50 receives the address DAi, which has been decoded by the column decoder 30 (see FIG. 1), and the column selection line disable signal CSLDIS, to generate the column selection signal CSLi, which enables the column selection lines. The CSL buffer 50 includes a pull-up unit 52, a pull-down unit 56 and a latch unit 58.

In particular, the pull-up unit 52 outputs the logic high level when the decoded address DAi is the logic low level and the column selection line disable signal CSLDIS is the logic low level. Preferably, the pull-up unit 52 includes a pull-up transistor 53, which has a source connected to power voltage Vcc and is turned on by the decoded address DAi, and a switching transistor 54, which is connected to the pull-up transistor 53 in series, and is turned on by the column selection line disable signal CSLDIS. Preferably, the pull-up transistor 53 and the switching transistor 54 are each implemented with a PMOS transistor.

The pull-down unit 56 outputs the logic low level when the decoded address DAi is the logic high level. The pull-down unit 56 includes a pull-down transistor, which has a source connected to ground voltage Vss and is turned on by the decoded address DAi. Preferably, the pull-down transistor 56 is implemented with an NMOS transistor. Also, the latch unit 58 inverts and latches the output of the pull-up unit 52 and the pull-down unit 56. Preferably, the latch unit 58 is implemented with an inverter latch.

Figure 9:
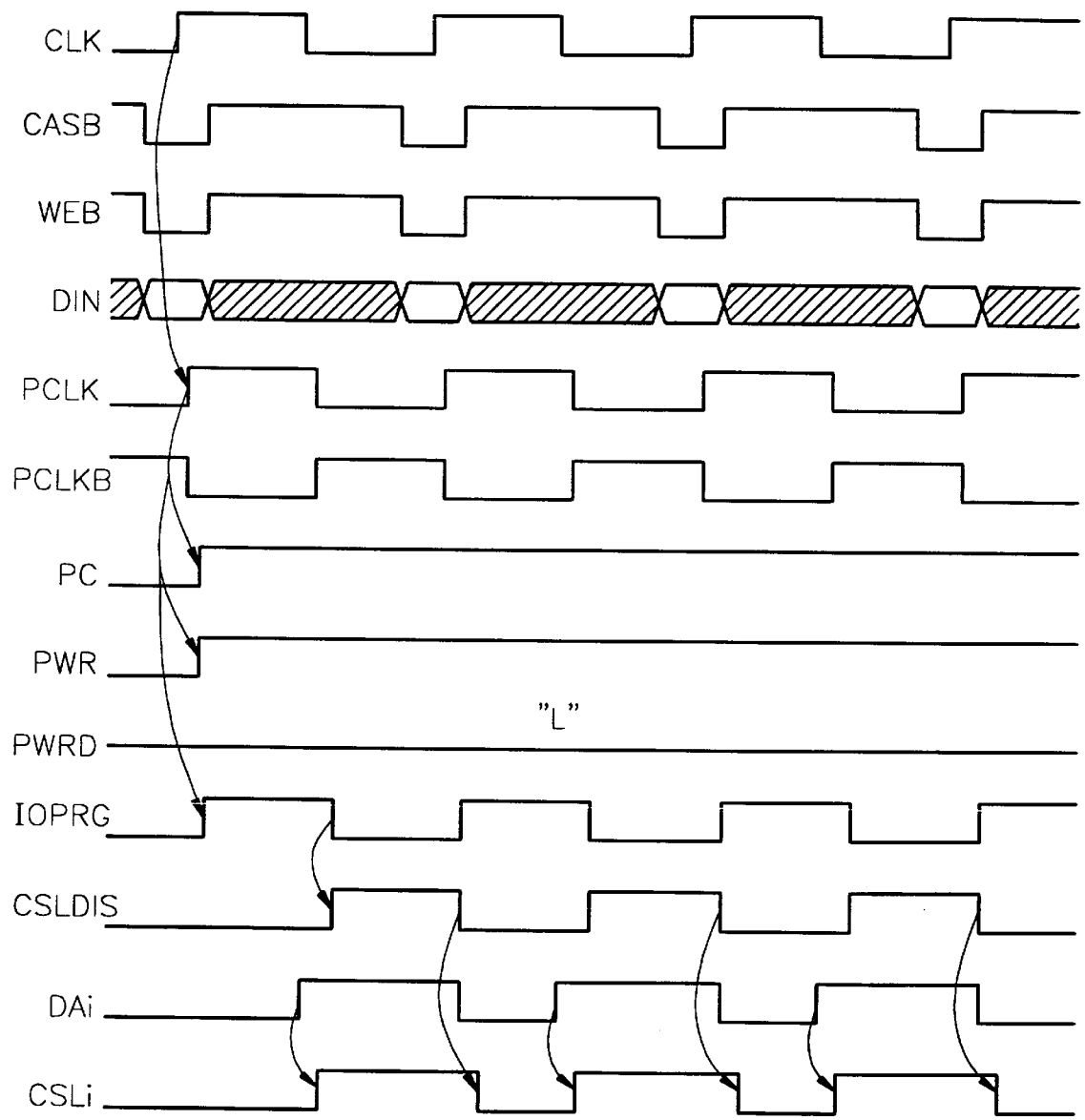
FIGS. 9 and 10 are timing diagrams of major signals in the operation of the memory device of FIG. 1.
Figure 10:
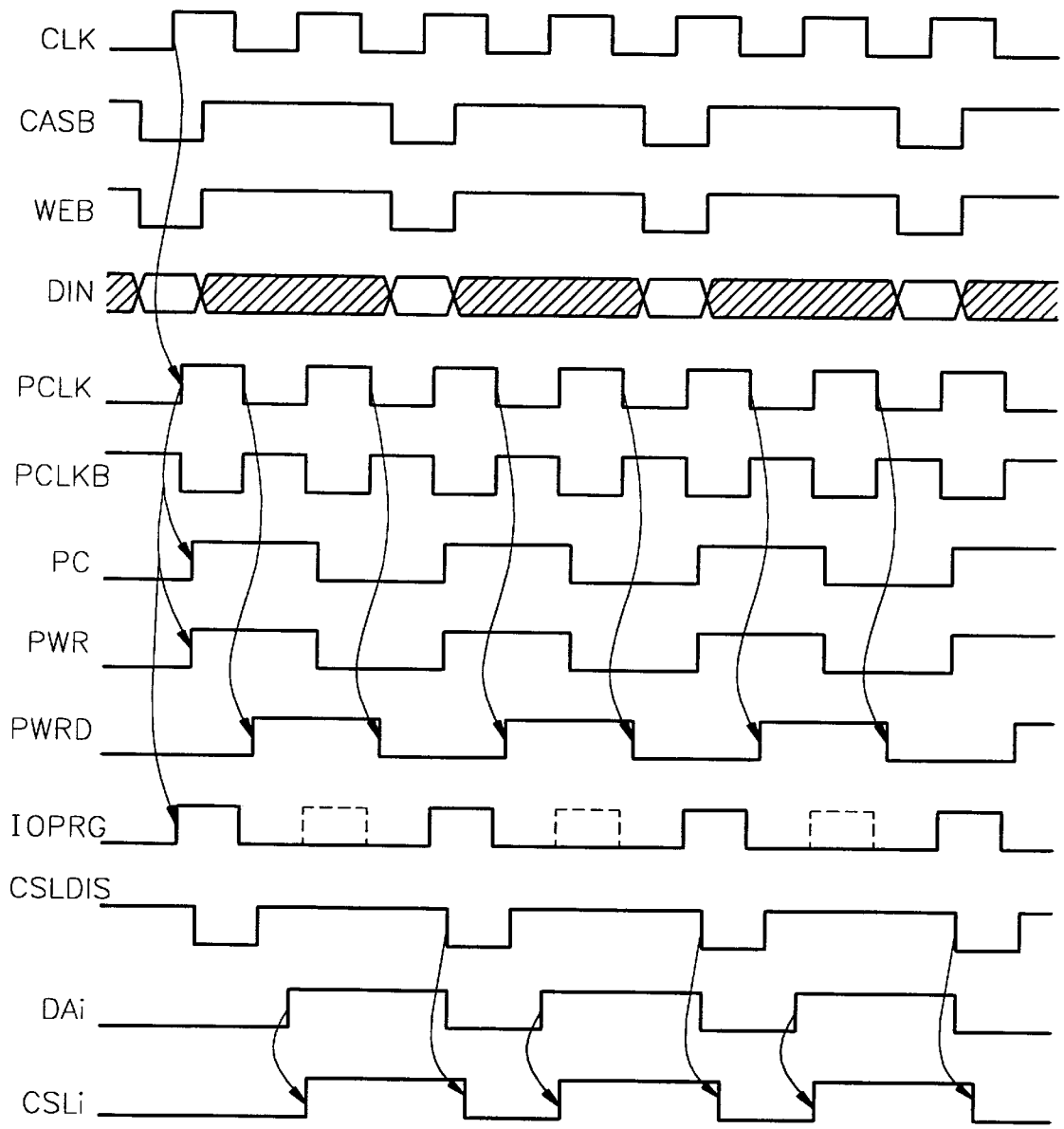

FIGS. 9 and 10 are timing diagrams of major signals associated with the operation of the memory device according to the present invention of FIG. 1 In FIGS. 9 and 10, in which four successive write operations are illustrated, it is assumed that the write cycle mode WM is implemented with a 1-bit mode register. The write cycle mode WM "0" is defined as the case where the system operates at a low operating speed and the number of reference clock signal cycles for a normal data write operation is one (see FIG. 9), and the write cycle mode WM "1" is defined as the case where the system operates at a high operating speed and the number of reference clock signal cycles for the normal data write operation is two (see FIG. 10).

First, in the write cycle mode "0" shown in FIG. 9, the memory device according to the present invention of FIG. 1 operates as follows. Write cycle modes are programmed in the MRS 90 (see FIG. 1) together with other operation modes, depending on the number of cycles of the reference clock signal PCLK required for normal execution of a write command.

When the column address strobe signal CASB and the write enable signal WEB go to the logic low level in synchronization with the system clock signal CLK, a variety of control signals, i.e., the column selection control signal PC, the write master signal PWR, the write master delay signal PWRD, the precharge signal IOPRG and the column selection line disable signal CSLDIS, are generated by the control signal generating circuit 100 (shown in FIG. 2). Then, write data DIN is input to the data input buffer 70 in response to the activation of the write enable signal WEB. The generation of the control signals by the control signal generating circuit 100 is described below in greater detail.

First, the reference clock signals PCLK and PCLKB having a predetermined cycle are generated by the clock buffer 110 (see FIG. 3) in response to the system clock signal CLK. In response to the first rising edge of the reference clock signal PCLK from the activation of the column address strobe signal CASB to the logic low level, the column selection control signal PC, which is at the logic high level, is generated by the column address strobe buffer 120 (see FIG. 4), and the write master signal PWR, which is at the logic high level, is generated by the write enable buffer 130 (see FIG. 5). Here, the column control signal PC remains at the logic high level during column selection. Also, the write master signal PWR also remains the logic high state during write operation, as does the column selection control signal PC. In addition, since the write cycle mode WM, which is at the logic low level, is input to the NAND gate 140 of the write enable buffer 130, the write master delay signal PWRD, which always remains at the logic low level irrespective of the generation of the write master signal PWR, is also generated.

In response to the write master delay signal PWRD and the reference clock signal PCLKB, the precharge signal IOPRG, which is at the logic high level for every cycle of the reference clock signal PCLKB, during which the write command is generated, is generated by the precharge signal generating circuit 150 (see FIG. 6).

Then, in response to the precharge signal IOPRG and the column selection control signal PC, the column selection line disable signal CSLDIS, which has the opposite phase to that of the precharge signal IOPRG and has been delayed for a predetermined period of time, is generated by the column selection line disable signal generating circuit 160 (see FIG. 7). The column selection line disable signal CSLDIS is enabled to the logic low level every cycle of the reference clock signal PCLK.

The control signals, i.e., the column selection line disable signal CSLDIS, the write master signal PWR and the precharge signal IOPRG, which are generated by the control signal generating circuit 100, are provided to the CSL buffer 50, the write driver 75 and the precharge circuit 80, respectively, to control the operation thereof.

For example, the precharge signal IOPRG drives the precharge circuit 80 to precharge the data input/output line pair IO and IOB with a level of half of the power supply voltage ½ Vcc. Here, as shown in the timing diagram of FIG. 9, since the precharge signal IOPRG is enabled to the logic high level for every cycle of the reference clock signal PCLK, the data input/output line pair IO and IOB are precharged every cycle of the reference clock signal PCLK.

Meanwhile, when the precharge signal IOPRG is disabled to the logic low level, the write master signal PWR drives the write driver 75, to transmit the write data DIN input through the data input buffer 70 to the data input/output line pair IO and IOB.

When the pull-down unit 56 of the column selection line buffer 50 (see FIG. 8) is turned on in response to the address DAi decoded by the column decoder 30, the column selection signal CSLi is generated by the CSL buffer 50. Accordingly, the column switch 60 (see FIG. 1) is turned on, so that the data input/output lines IO and IOB are connected to the corresponding bit line pair BLi and BLBi. Then, the write data DIN transmitted to the data input/output line pair IO and IOB is loaded onto the corresponding bit line pair BLi and BLBi through the sense amplifying circuit 65, and then written to the memory cell MC.

When the decoded address DAi goes to the logic low level and the column selection line disable signal CSLDIS goes to the logic low level, the column selection signal CSLI is disabled to the logic low level. Accordingly, the column switch 60 (FIG. 1) is turned off, and the data input/output line pair IO and IOB are disconnected from the bit line pair BLi and BLBi, and thus one write operation is completed. Here, as shown in FIG. 9, the column selection line disable signal CSLDIS is enabled to the logic low level and the column selection signal CSLi is disabled to the logic low level every cycle of the reference clock signal PCLK.

Thus, when the system operates at a speed which is low enough to perform one write operation within one cycle of the reference clock signal PCLK, the memory device according to the present invention sets the above-mentioned write cycle mode, to enable the precharge signal IOPRG and the column selection line disable signal CSLDIS every cycle of the reference clock signal PCLK. Accordingly, the write operation can be carried out every cycle of the reference clock signal PCLK.

Next, in the write cycle mode "1" shown in FIG. 10, the memory device according to the present invention of FIG. 1 operates as follows. The column address strobe signal CASB and the write enable signal WEB are enabled every second cycle of the system clock signal CLK. Also, the write data DIN is input to the data input buffer 70 every second cycle of the system clock signal CLK.

First, the reference clock signals PCLK and PCLKB having a predetermined cycle are generated by the clock buffer 110 (see FIG. 3) in response to the system clock signal CLK. The column selection control signal PC, which is enabled to the logic high level in response to the first rising edge of the reference clock signal PCLK from the activation of the column address strobe signal CASB, and is toggled in response to a second rising edge of the reference clock signal PCLK, is generated by the column address strobe buffer 120 (see FIG. 4). Also, the write master signal PWR, which is enabled to the logic high level in response to the first rising edge of the reference clock signal PCLK from the activation of the write enable signal WEB, and is toggled in response to the second rising edge of the reference clock signal PCLK, is generated by the write enable buffer 130 (see FIG. 5). In addition, since the write cycle mode WM, which is at the logic high level, is input, the write master delay signal PWRD, which is delayed by half of clock cycle, is generated by the write enable buffer 130.

In response to the logic low level of the write master delay signal PWRD and the reference clock signal PCLKB, the precharge signal IOPRG, which is enabled at a logic high for a predetermined period of time, is generated by the precharge signal generating circuit 150 (see FIG. 6). Also, the precharge signal IOPRG is disabled to the logic low level by the write master delay signal PWRD that is at the logic high level. In other words, as shown in FIG. 10, the precharge signal IOPRG, which is generated in response to the second rising edge of the reference clock signal PCLK after the activation of the write enable signal WEB, is disabled to the logic low level due to the write master delay signal PWRD that remains at the logic high level. Accordingly, the precharge signal IOPRG is enabled every second cycle of the reference clock signal PCLK, so that the data input/output line pair IO and IOB are precharged with a level of half of the power supply voltage ½ Vcc every second reference clock cycle.

Then, in response to the precharge signal IOPRG and the column selection control signal PC, the column selection line disable signal CSLDIS, which has the opposite phase to that of the precharge signal IOPRG and has been delayed for a predetermined period of time, is generated by the column selection line disable signal generating circuit 160 (see FIG. 7). The column selection line disable signal CSLDIS is enabled to the logic low level every second cycle of the reference clock signal PCLK, as does the precharge signal IOPRG. Thus, as shown in FIG. 10, the column selection signal CSLi is disabled every second cycle of the reference clock signal PCLK.

In other words, the column selection signal CSLi is enabled in response to the address DAi decoded by the column decoder 30 and is disabled in response to the column selection line disable signal CSLDIS every second cycle of the reference clock signal. Accordingly, the write operation is carried out every second cycle of the reference clock signal.

Thus, when the system operates at a speed which is too high to perform a normal write operation within one cycle of the reference clock signal PCLK, the memory device according to the present invention sets the above-mentioned write cycle mode which allows the write operation once within two reference clock cycles, such that the precharge signal IOPRG and the column selection line disable signal CSLDIS are enabled every second cycle of the reference clock signal PCLK. Accordingly, the write operation can be normally carried out once every second cycle of the reference clock signal PCLK.

In the synchronous memory device and the data write method using the same according to the present invention, the write cycle modes are programmed in the mode register set with the system clock frequency information. When an appropriate write cycle mode is selected by a user, the write operation of the memory device can be controlled according to the system clock frequency. That is, the number of cycles per data writing operation can be varied with respect to programmed write cycle modes, so that although the system clock cycle is short due to the high operating speed of the system, the memory device can carry out the normal write operation. As a result, the operating speed of the system can be increased to a maximum level without taking into account the data write period of time of the memory device.

While this invention has been particularly shown and described with reference to preferred embodiments thereof, it will be understood by those skilled in the art that various changes in form and details may be made therein without departing from the spirit and scope of the invention as defined by the appended claims. For example, although the preferred embodiment is described with reference to the particular circuits for generating a variety of control signals, it is appreciated that the control signal generating circuit described may be implemented with another circuit which generates signals having the same or similar waveforms as those of FIGS. 9 and 10.

I claim:

1. A synchronous memory device for performing a write operation in synchronism with a reference clock signal, comprising:
   a memory cell array including a plurality of memory cells arranged in rows and columns;
   a precharge circuit for precharging to a voltage level a data input/output line which transmits data to be written to the memory cells;
   a column selection circuit for writing the data transmitted to the data input/output line to a selected memory cell, in response to activation of a column selection signal; and
   a mode register set for setting write cycle modes,
   wherein the activation cycle of the column selection signal is determined as a function of write cycle modes programmed in the mode register set.

2. The synchronous memory device of claim 1, wherein one of the write cycle modes is selected by a user.

3. The synchronous memory device of claim 1, wherein the write cycle modes are programmed using at least one bit of the mode register which is comprised of a plurality of bits.

4. The synchronous memory device of claim 1, wherein the write cycle modes are classified according to the number of reference clock cycles for a period of time from the input of a write command to the writing of data to the memory cell.

5. The synchronous memory device of claim 4, wherein the write cycle modes comprise a first write cycle mode in which the column selection signal is activated for one reference clock cycle for a write operation, and a second write cycle mode in which the column selection signal is activated for a plurality of reference clock cycles for a write operation.

6. The synchronous memory device of claim 5, wherein in the second write cycle mode the column selection signal is activated for two reference clock cycles for a write operation.

7. A synchronous memory device for initiating a write operation of data to a memory cell in response to the activation of a column selection signal after receipt of a write command, and terminating the write operation in response to inactivation of the column selection signal, the synchronous memory device comprising:
   a control signal generating circuit for receiving a system clock signal, a column address strobe signal and a write enable signal to generate a column selection line disable signal which disables the column selection signal;
   a mode register set into which write cycle modes are programmed, one of the write cycle modes being selected in response to an address designated by a user,
   wherein the activation cycle of the column selection signal is determined as a function of the write cycle mode which are programmed into the mode register set.

8. The synchronous memory device of claim 7, wherein one of the write cycle modes is selected by a user.

9. The synchronous memory device of claim 7, wherein the synchronous memory device further comprises a column selection line buffer for writing data of a data input/output line pair to a selected memory cell, in response to the activation of the column selection signal, and the column selection line buffer comprises:

a pull-up unit including a pull-up transistor which has a source connected to first potential and a control terminal for receiving a decoded column address, said pull-up unit being disabled in response to receipt of a decoded column address, and a switching transistor which is connected in series to the pull-up transistor, said switching transistor including a control terminal for receiving a column selection line disable signal, said switching transistor being turned on in response to activation of the column selection line disable signal;

a pull-down unit including a pull-down transistor which has a source connected to a second potential and a control terminal for receiving a decoded column address, said pull-down unit being enabled in response to activation of the decoded column address; and a latch unit for inverting and latching the output of the pull-up unit and the pull-down unit.

10. The synchronous memory device of claim 7, wherein the write cycle modes are classified according to the number of reference clock cycles for a period of time from the input of a write command to the writing of data to the memory cell.

11. The synchronous memory device of claim 10, wherein the write cycle modes comprise a first write cycle mode in which the column selection signal is activated for one reference clock cycle for a write operation, and a second write cycle mode in which the column selection signal is activated for a plurality of reference clock cycles for a write operation.

12. The synchronous memory device of claim 11, wherein in the second write cycle mode the column selection signal is activated for two reference clock cycles for a write operation.

13. The synchronous memory device of claim 7, wherein the control signal generating circuit comprises:

a clock buffer for generating in response to the system clock signal a reference clock signal based on which data are input and output;

a column address strobe buffer for generating a column selection control signal that is enabled for a predetermined period of time in response to activation of the column address strobe signal;

a write enable buffer for generating a write master signal that is enabled for a predetermined period of time in response to the activation of the write enable signal, and generating a write master delay signal, which is delayed by a predetermined period of time relative to the write master signal, in the second write cycle mode;

a precharge signal generating circuit for precharging a data input/output line in response to the reference clock signal, and generating a precharge signal which is disabled for a predetermined period of time during which the write master delay signal is enabled; and a column selection line disable signal generating circuit for generating a column selection line disable signal that disables a column selection line, in response to the precharge signal and the column selection control signal.

14. The synchronous memory device of claim 13, wherein the column address strobe buffer comprises:

an inverting unit for inverting and outputting the column address strobe signal;

a first transfer unit for inverting and outputting the output signal from the inverting unit in response to the falling edge of the reference clock signal; and a second transfer unit for inverting and outputting the output signal from the first transfer unit in response to the rising edge of the reference clock signal.

15. The synchronous memory device of claim 13, wherein the write enable buffer comprises:

a first inverting unit for inverting and outputting the write enable signal;

a first transfer unit for receiving the output signal from the first inverting unit in response to the falling edge of the reference clock signal, and inverting and latching the received signal for one cycle of the reference clock signal;

a second transfer unit for receiving the output signal from the first transfer unit in response to the rising edge of the reference clock signal, and inverting and latching the received signal for one cycle of the reference clock signal to generate the write master signal;

a third transfer unit for receiving the write master signal in response to the falling edge of the reference clock signal, and inverting and latching the write master signal for one cycle of the reference clock signal in the corresponding write cycle modes; and a second inverting unit for inverting the output signal from the third transfer unit to output the write master delay signal.

16. The synchronous memory device of claim 13, wherein the precharge signal generating circuit comprises:

a NOR gate for receiving the reference clock signal and the write master delay signal; and a delay unit for delaying the output signal from the 2-input NOR gate by a predetermined period of time.

17. The synchronous memory device of claim 13, wherein the column selection line disable signal generating circuit comprises:

an inverting unit for inverting the column selection control signal;

a NOR gate for receiving the output signal from the inverting unit and the precharge signal; and a delay unit for delaying the output signal from the NOR gate by a predetermined period of time.

18. A data write method of a synchronous memory device for writing data to a particular memory cell in response to activation of a column selection signal, the method comprising:

programming the number of reference clock cycles required for execution of a write command, and storing the programmed data in at least one bit of a mode register set of the synchronous memory device;

receiving a write enable signal, which changes a mode to a write mode, to generate a write master signal and a write master delay signal;

generating an input/output line precharge signal in response to a reference clock signal and the write master delay signal, the precharge signal being disabled for the execution of the write command if the programmed number of reference clock cycles is more than one;

generating a column selection line disable signal which is disabled in response to activation of the precharge signal; and generating a column selection signal which is enabled in response to the activation of the column selection line corresponding to a decoded address, and is disabled in response to the column selection line disable signal.

19. The data write method of claim 18, wherein the elapsed number of reference clock cycles for a data writing operation varies according to the programmed number of reference clock cycles.

* * * * *